US010833159B1

(12) United States Patent
Hao et al.

(10) Patent No.: US 10,833,159 B1
(45) Date of Patent: Nov. 10, 2020

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Ronghui Hao, Zhuhai (CN); King Yuen Wong, Zhuhai (CN)

(73) Assignee: INNOSCIENCE (SUZHOU) TECHNOLOGY CO., LTD., Suzhou (CN)

(*) Notice: Subject to any disclaimer, the term of this patent is extended or adjusted under 35 U.S.C. 154(b) by 0 days.

(21) Appl. No.: 16/874,653

(22) Filed: May 14, 2020

(30) Foreign Application Priority Data

Apr. 30, 2020 (WO) ................ PCT/CN2020/088486

(51) Int. Cl.
*H01L 29/10* (2006.01)
*H01L 29/205* (2006.01)
*H01L 29/20* (2006.01)
*H01L 29/778* (2006.01)

(52) U.S. Cl.
CPC ...... *H01L 29/1029* (2013.01); *H01L 29/2003* (2013.01); *H01L 29/205* (2013.01); *H01L 29/7783* (2013.01)

(58) Field of Classification Search
CPC ............. H01L 29/1029; H01L 29/1066; H01L 29/402
See application file for complete search history.

(56) References Cited

U.S. PATENT DOCUMENTS

| 7,576,373 | B1 | 8/2009 | Hikita et al. |
| 7,728,356 | B2 | 6/2010 | Suh et al. |
| 8,148,752 | B2 | 4/2012 | Ikoshi et al. |
| 8,350,294 | B2 | 1/2013 | Lidow et al. |
| 8,552,471 | B2 | 10/2013 | Okamoto et al. |
| 8,692,292 | B2 | 4/2014 | Umeda et al. |
| 8,969,918 | B2 | 3/2015 | Lidow et al. |
| 9,018,634 | B2 | 4/2015 | Tanaka et al. |
| 9,117,890 | B2 | 8/2015 | Kim et al. |
| 9,231,059 | B2 | 1/2016 | Negoro et al. |
| 9,362,389 | B2 | 6/2016 | Xing et al. |
| 9,831,331 | B2 | 11/2017 | Morancho et al. |
| 2005/0051796 | A1* | 3/2005 | Parikh ............... H01L 29/402 257/192 |

(Continued)

*Primary Examiner* — Thomas L Dickey
(74) *Attorney, Agent, or Firm* — Idea Intellectual Limited; Margaret A. Burke; Sam T. Yip

(57) ABSTRACT

A semiconductor device includes a first semiconductor layer, a second semiconductor layer, a source, a drain, a gate structure, and a first p-type doped III-V compound/nitride semiconductor layer. The second semiconductor layer is disposed on the first semiconductor layer and has a bandgap greater than a bandgap of the first semiconductor layer. The source and the drain are disposed on the second semiconductor layer. The gate structure is disposed on the second semiconductor layer and between the source and the drain. The first p-type doped III-V/nitride semiconductor compound layer is disposed on the second semiconductor layer and between the gate structure and the drain with the drain at least partially covering the p-doped layer such that the first p-type doped III-V compound/nitride semiconductor layer and the drain are electrically coupled with each other.

20 Claims, 13 Drawing Sheets

(56) References Cited

U.S. PATENT DOCUMENTS

| | | | |
|---|---|---|---|
| 2015/0270379 A1* | 9/2015 | Kuraguchi | H01L 29/063 257/194 |
| 2017/0179272 A1* | 6/2017 | You | H01L 29/42316 |
| 2019/0326426 A1 | 10/2019 | Park et al. | |
| 2019/0326427 A1 | 10/2019 | Kinzer et al. | |

* cited by examiner

SEMICONDUCTOR DEVICE AND METHOD FOR MANUFACTURING THE SAME

CROSS-REFERENCES TO RELATED APPLICATIONS

The present application claims priority from the International Patent Application No. PCT/CN2020/088486 filed on Apr. 30, 2020, the disclosure of which is hereby incorporated by reference in its entirety.

FIELD OF THE INVENTION

The present invention generally relates to a semiconductor device. More specifically, the present invention relates to a high electron mobility transistor (HEMT) semiconductor device with a p-type doped III-V compound/nitride semiconductor layer to reduce a hot carrier effect.

BACKGROUND OF THE INVENTION

In recent years, intense research on high-electron-mobility transistors (HEMTs) has been prevalent for semiconductor devices, such as high power switching and high frequency applications. The HEMT utilizes a junction between two materials with different bandgaps as a channel. For example, an AlGaN/GaN HEMT is a heterojunction device that is able to operate at higher frequencies than ordinary transistors. In a HEMT heterostructure, a bandgap discontinuity between two different materials forms a quantum well-like structure, which accommodates a two-dimensional electron gas (2DEG) and results in an increased sheet carrier concentration at the heterojunction interface, which is able to satisfy demands of high power/frequency devices. Examples of devices having heterostructures include heterojunction bipolar transistors (HBT), heterojunction field effect transistors (HFET), high-electron-mobility transistors (HEMT), or modulation-doped FETs (MODFET).

Currently, there is a need to improve device performance and cure existing deficiencies. For example, during device operation, a hot carrier effect may occur. That is, hot carriers with sufficient energy will tunnel through a thin layer to show up as a leakage current. These hot-carrier electrons may jump from a channel region or drain to a gate or substrate. Hot-carrier electrons do not contribute to the current flowing through a channel as intended, but instead flow as a leakage current. The presence of such carriers in a device triggers numerous physical damage processes that can drastically change the device's characteristics, which will eventually cause circuits incorporating the device to fail. Therefore, there is a need in the art for a new HEMT structure for preventing the hot carrier effect thereby improving device performance and reliability.

SUMMARY OF THE INVENTION

In accordance with one aspect of the present disclosure, a semiconductor device with a p-type doped nitride semiconductor layer is provided. A semiconductor device includes a first semiconductor layer, a second semiconductor layer, a source, a drain, a gate structure, and a first p-type doped nitride semiconductor layer. The second semiconductor layer is disposed on the first semiconductor layer and has a bandgap greater than a bandgap of the first semiconductor layer. The source and the drain are disposed on the second semiconductor layer. The gate structure is disposed on the second semiconductor layer and between the source and the drain. The first p-type doped nitride semiconductor layer is disposed on the second semiconductor layer and between the gate structure and the drain. The drain is closer to the first p-type doped nitride semiconductor layer than the gate structure. At least a portion of the drain is positioned over at least a portion of the first p-type doped nitride semiconductor layer. The first p-type doped nitride semiconductor layer and the drain are electrically coupled with each other. A second p-type doped nitride semiconductor layer is positioned on the second semiconductor layer beneath the gate.

In some embodiments, the first semiconductor layer includes undoped GaN, the second semiconductor layer includes AlGaN, and the first and second p-type doped nitride semiconductor layers include p-GaN, which is advantageous to form a p-n junction between the second semiconductor layer and the first or second p-type doped nitride semiconductor layer.

In accordance with another aspect of the present disclosure, a method for manufacturing a semiconductor device with a p-type doped nitride semiconductor layer is provided. The method includes steps as follows. A first semiconductor layer is formed above a substrate. A second semiconductor layer is formed on the first semiconductor layer, in which the second semiconductor layer has a bandgap greater than a bandgap of the first semiconductor layer. A first p-type doped nitride semiconductor layer is formed on the second semiconductor layer. A source, a drain, and a gate structure are formed on the second semiconductor layer, in which the drain is formed to be closer to the first p-type doped nitride semiconductor layer than the gate structure. The resulted structure has islands of the first p-type doped nitride semiconductor layer electrically coupled with the drain and forming a p-n junction with the second semiconductor layer to reduce an electric field at a drain edge.

By applying such configuration above, the presence of the first p-type doped nitride semiconductor layer advantageously improves reliability issues of the semiconductor device caused by the hot carrier effect. Since the strength of an electric field at a drain edge increases as a drain voltage increases, a very high electric field in this region creates generation of electron-hole pairs by impact ionization, which supplies hot carrier electrons with sufficient energy to unexpectedly penetrate some layers in the semiconductor device and results in permanent degradation to the semiconductor device. Briefly, with the p-n junction formed between the first p-type doped nitride semiconductor layer and the second semiconductor layer, the first p-type doped nitride semiconductor layer is able to supply minority charge carriers into the first semiconductor layer, thereby suppressing an electric field at a drain edge. As such, hot carrier electrons are reduced due to reduction of the electric field at the drain edge, such that the reliability issues of the semiconductor device are improved.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Embodiments of the invention are described in more detail hereinafter with reference to the drawings, in which.

DETAILED DESCRIPTION

Figure 1A:
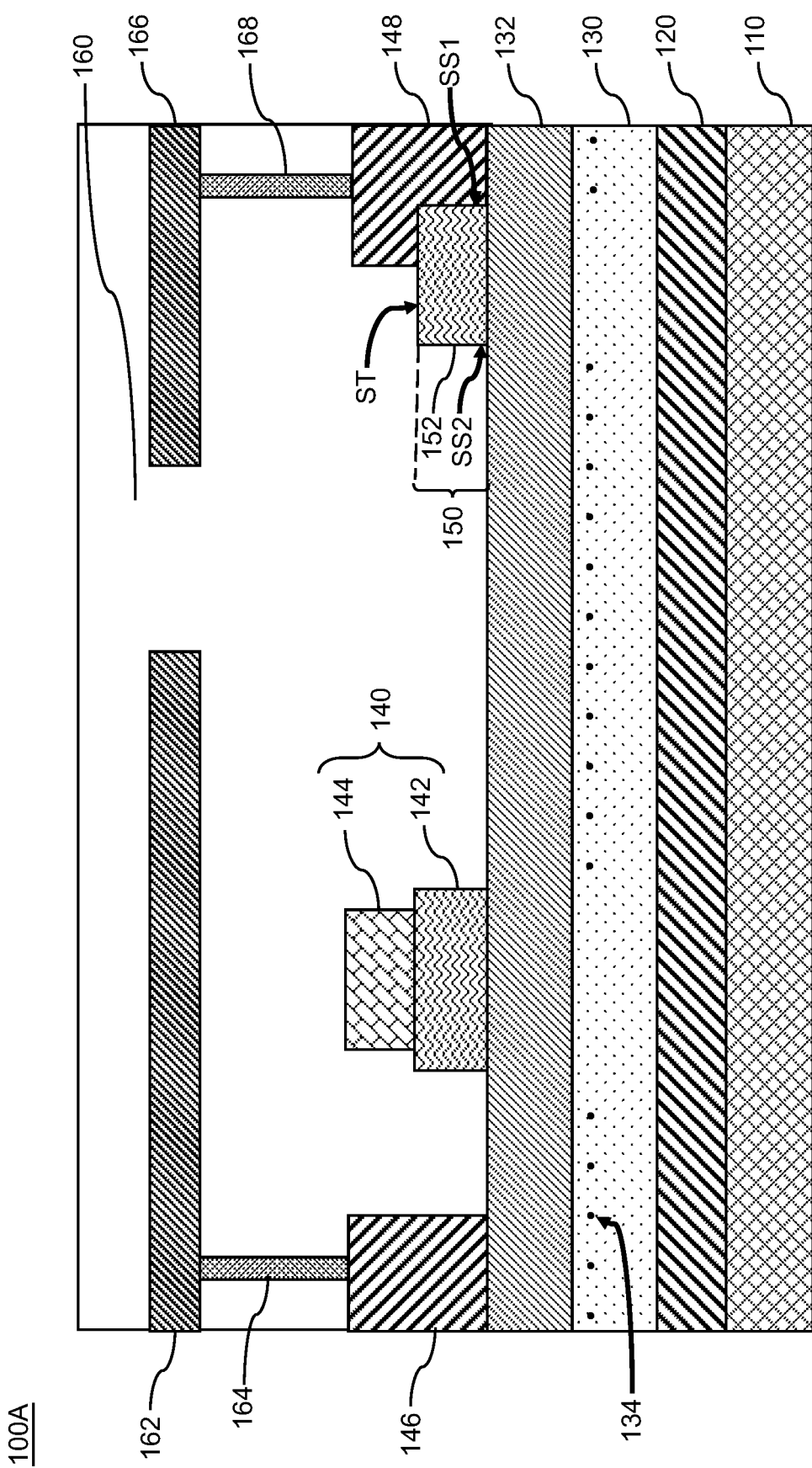
FIGS. 1A and 1B are cross-section and top views of a semiconductor device according to some embodiments of a present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, semiconductor devices, methods for manufacturing the same, and the likes are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1B:
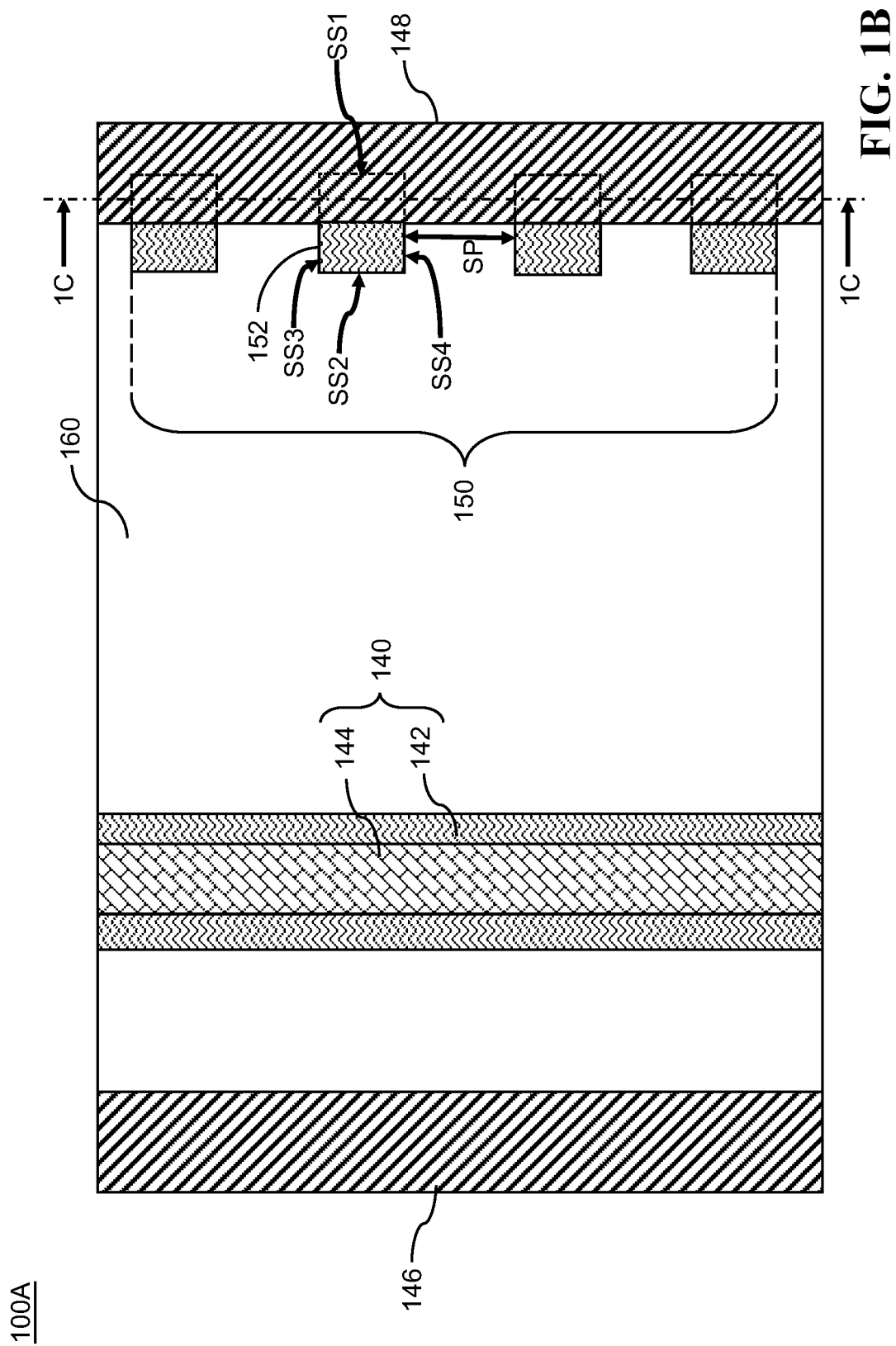

FIGS. 1A and 1B are cross-section and top views of a semiconductor device 100A according to some embodiments of a present disclosure. A semiconductor device 100A includes a substrate 110, a buffer layer 120, a semiconductor layer 130, a semiconductor layer 132, a gate structure 140, a source 146, a drain 148, and a p-type doped III-V compound/nitride semiconductor layer 150. For simplicity, some of elements from FIG. 1A are omitted in FIG. 1B.

The exemplary material of substrate 110 can include, for example but is not limited to, Si, SiGe, SiC, gallium arsenide, p-doped Si, n-doped Si, sapphire, semiconductor on insulator, such as silicon on insulator (SOI), or other suitable semiconductor materials including group III elements, group IV elements, group V elements, or combinations thereof. In some other embodiments, the substrate 110 can include one or more other features, such as a doped region, a buried layer, an epitaxy (epi) layer, or combination thereof.

The buffer layer 120 is disposed on the substrate 110. The exemplary material of the buffer layer 120 can include, for example but is not limited to, nitrides or group III-V compounds, such as GaN, GaAs, InN, AlN, InGaN, AlGaN, InAlGaN, or combinations thereof. The buffer layer 120 is provided for reducing lattice and thermal mismatches between the substrate 110 and a layer to be formed above the buffer layer 120 (e.g. epitaxially formed thereon), thereby curing defects due to the mismatches. That is, with the buffer layer 120, occurrence of dislocation and defects is reduced. The buffer layer may be a single layer or plural layers having the same or different compositions and may be the same material deposited under different conditions.

The semiconductor layer 130 is disposed on the buffer layer 120. The exemplary material of the semiconductor layer 130 can include, for example but is not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The semiconductor layer 132 is disposed on the semiconductor layer 130. The exemplary material of the semiconductor layer 132 can include, for example but is not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the semiconductor layers 130 and 132 are selected such that the semiconductor layer 132 has a bandgap (i.e. forbidden band width) greater than a bandgap of the semiconductor layer 130, which causes electron affinities thereof different from each other. For example, when the semiconductor layer 130 is an undoped GaN layer having bandgap of approximately 3.4 eV, the semiconductor layer 132 may be an AlGaN layer having bandgap of approximately 4.0 eV. As such, the semiconductor layers 130 and 132 serve as a channel layer and a barrier layer, respectively. A triangular well potential is generated at a bonded interface between the channel and barrier layers, so that electrons accumulate in the triangular well potential, thereby generating a two-dimensional electron gas (2DEG) region 134 at the same interface. Accordingly, the semiconductor device 100A can serve as a high-electron-mobility transistor (HEMT).

A gate structure 140 is disposed on the semiconductor layer 132. In the present embodiment, the gate structure 140 includes a p-type doped III-V compound layer/nitride semiconductor layer 142 forming an interface with the semiconductor layer 132 and a conductive gate 144 stacked on the p-type doped III-V compound/nitride semiconductor layer 132. In other embodiments, the gate structure 140 may further include a dielectric structure (not illustrated) between the p-type doped III-V compound/nitride semiconductor layer 142 and the conductive gate 144, in which the dielectric structure can be formed by one or more layers of dielectric materials.

In the present disclosure, the semiconductor device 100A is an enhancement mode device, which is in a normally-off state when the conductive gate 144 is at approximately zero bias. Specifically, the elongated or strip p-type doped III-V compound/nitride semiconductor layer 142 creates a p-n junction with the semiconductor layer 132 to deplete the 2DEG region 134, such that a zone of the 2DEG region 134 corresponding to a position below the gate structure 140 has different characteristics (e.g. different electron concentrations) than the rest of the 2DEG region 134 and thus is blocked.

Due to such mechanism, the semiconductor device 100A has a normally-off characteristic. In other words, when no voltage is applied to the gate 144 or a voltage applied to the gate 144 is less than a threshold voltage (i.e. a minimum voltage required to form an inversion layer below the gate structure 140), the zone of the 2DEG region 134 below the gate structure 140 is kept blocked, and thus no current flows therethrough. Moreover, by providing the p-type doped III-V compound/nitride semiconductor layer 142, gate leakage current is reduced and an increase in the threshold voltage during the off-state is achieved.

The exemplary material of the p-type doped III-V compound layer 142 can include, for example but is not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd. In one embodiment, the semiconductor layer 130 includes undoped GaN and the semiconductor layer 132 includes AlGaN, and the p-type doped III-V compound layer 142 is a p-type GaN layer which can bend the underlying band structure upwards and to deplete the corresponding zone of the 2DEG region 134, so as to place the semiconductor device 100A into an off-state condition. The exemplary material of the conductive gate 144 may be metals or metal compounds including, but not limited to W, Au, Pd, Ti, Ta, Co, Ni, Pt, Mo, TiN, TaN, other metallic compounds, nitrides, oxides, silicides, doped semiconductors, metal alloys, or combinations thereof. The optional dielectric structure can include, for example but is not limited to, one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc), or combinations thereof.

The source 146 and the drain 148 are disposed on the semiconductor layer 132 and located at two opposite sides of the gate structure 140 (i.e. the gate structure 140 is located between the source 146 and the drain 148). In the exemplary illustration of FIG. 1A, the source 146 and the drain 148 are asymmetrical about the gate structure 140, with the source 146 closer to the gate structure 140 than the drain 148. The present disclosure is not limited thereto, and the configuration of the source 146 and the drain 148 is adjustable. The exemplary materials of the source 146 and the drain 148 can include, for example but is not limited to, metals, alloys, doped semiconductor materials (such as doped crystalline silicon), other conductor materials, or combinations thereof.

Although the gate 144 as illustrated in FIG. 1A is a single layer structure, however, it is contemplated that the gate 144 can have a multi-layer structure. In some embodiments, each of the multi-layer structure of the gate 144 can have same or similar material to another layer. In some embodiments, each of the multi-layer structure of the gate 144 can have different material from another layer.

Although the source 146 as illustrated in FIG. 1A is a single layer structure, however, it is contemplated that the source 146 can have a multi-layer structure. In some embodiments, each of the multi-layer structure of the source 146 can have same or similar material to another layer. In some embodiments, each of the multi-layer structure of the source 146 can have different material from another layer.

Although the drain 148 as illustrated in FIG. 1A is a single layer structure, however, it is contemplated that the drain 148 can have a multi-layer structure. In some embodiments, each of the multi-layer structure of the drain 148 can have same or similar material to another layer. In some embodiments, each of the multi-layer structure of the drain 148 can have different material from another layer.

The p-type doped III-V compound/nitride semiconductor layer 150 is disposed on the semiconductor layer 132 and between the gate structure 140 and the drain 148, in which the drain 148 is closer to the p-type doped III-V compound/nitride semiconductor layer 150 than the gate structure 140.

In the exemplary illustration of FIGS. 1A and 1B, the first p-type doped III-V compound/nitride semiconductor layer 150 is in contact with the drain 148 and thus is electrically coupled with the drain 148, and at least one surface of the p-type doped III-V compound/nitride semiconductor layer 150 forms at least one interface with the drain 148. Specifically, the p-type doped III-V compound/nitride semiconductor layer 150 has a side surface SS1 facing away from the gate structure 140 and a top surface ST facing away from the second semiconductor layer 132. The side and top surfaces SS1 and ST form interfaces with the drain 148, and these interfaces extend along different directions (e.g. vertical and horizontal directions). Furthermore, the p-type doped III-V compound/nitride semiconductor layer 150 has a side surface SS2 which faces the gate structure 140 and is closer to the gate structure 140 than the drain 148, such that the drain 148 and the p-type doped III-V compound/nitride semiconductor layer 150 collectively form a step-shaped profile on the semiconductor layer 132.

The p-type doped III-V compound/nitride semiconductor layer 150 improves reliability issues of the semiconductor device 100A caused by a hot carrier effect. Generally, the strength of an electric field at a drain edge increases as a drain voltage increases, due to the dramatic change in potential at the drain edge. Accordingly, in a semiconductor device, a very high electric field in this region creates generation of electron-hole pairs by impact ionization. Electrons generated by this mechanism have sufficient energy to unexpectedly penetrate some layers of regions in the semiconductor device, which causes permanent degradation to the semiconductor device. In other words, if a semiconductor device is allowed to operate beyond these safe operating conditions, significant reliability degradation will likely result.

In order to cure such deficiencies, the p-type doped III-V compound/nitride semiconductor layer 150 in contact with the drain 148 forms a p-n junction with the semiconductor layer 132, such that the p-type doped III-V compound/nitride semiconductor layer 150 is able to supply minority charge carriers (e.g., holes) into the semiconductor layer 130, thereby suppressing an electric field at a drain edge (e.g. an edge of the drain 148). As a result, hot carrier electrons are reduced due to reduction of the electric field at the drain edge, thereby improving the reliability of the semiconductor device 100A. For example, with the improvement, the semiconductor device 100A is capable of allowing a higher critical current $I_d$ (i.e., drain current) to flow therethrough and a higher drain-to-source voltage Vds when the on-resistance ($R_{on}$) starts to degrade. With such contribution, the semiconductor device 100A may be employed in higher voltage applications than prior devices. Accordingly, the semiconductor device 100A with such p-type doped III-V compound/nitride semiconductor layer is referred to as a reduced surface field (RESURF) device which performs at high or ultra-high voltage. In addition to the mechanism above, due to suppression of an electric field at the drain edge, electric field strength is effectively relieved, which can enhance a breakdown voltage of the semiconductor device 100A. In some embodiments, the semiconductor device 100A is allowed to operate in a high voltage condition in a range from approximately 20V to approximately 1200V. In various embodiments, the reliability of the semiconductor device 100A allows the semiconductor device 100A to operate with a breakdown voltage of at least approximately 20 V.

Furthermore, because the impedance from the 2DEG region 134 toward the drain 148 is considered, the p-type doped III-V compound/nitride semiconductor layer 150 is set at a position between the gate structure 140 and the drain 148.

Referring to FIG. 1B, the p-type doped III-V compound/nitride semiconductor layer 150 has a plurality of p-type doped III-V compound/nitride semiconductor islands 152. In some embodiments, each of the p-type doped III-V compound/nitride semiconductor islands 152 is rectangular and has a length in a range from approximately 0.1 micron (μm) to approximately 3 μm and a width in a range from approximately 0.1 μm to approximately 3 μm. The rectangular p-type doped III-V compound/nitride semiconductor island 152 is defined when viewed in a direction normal to the second semiconductor layer 132. The present disclosure is not limited thereto, in other embodiments, each of the p-type doped III-V compound/nitride semiconductor islands 152 can be other polygonal shapes. The drain 148 has a width greater than the overlapped width of the drain 148 and any one of the p-type doped III-V compound/nitride semiconductor islands 152.

The p-type doped III-V compound/nitride semiconductor islands 152 are separated from each other at least by the drain 148 and are arranged along a direction (e.g. a vertical direction of FIG. 1B) by the same spacing SP. In some embodiments, the spacing SP for the p-type doped III-V compound/nitride semiconductor islands 152 is in a range from approximately 0.1 μm to approximately 10 μm. Furthermore, the drain 148 fills an interval between the p-type doped III-V compound/nitride semiconductor island 152, such that each of the p-type doped III-V compound/nitride semiconductor islands 152 has two opposite side surfaces SS3 and SS4 at least partially covered by the drain 148.

Figure 1C:
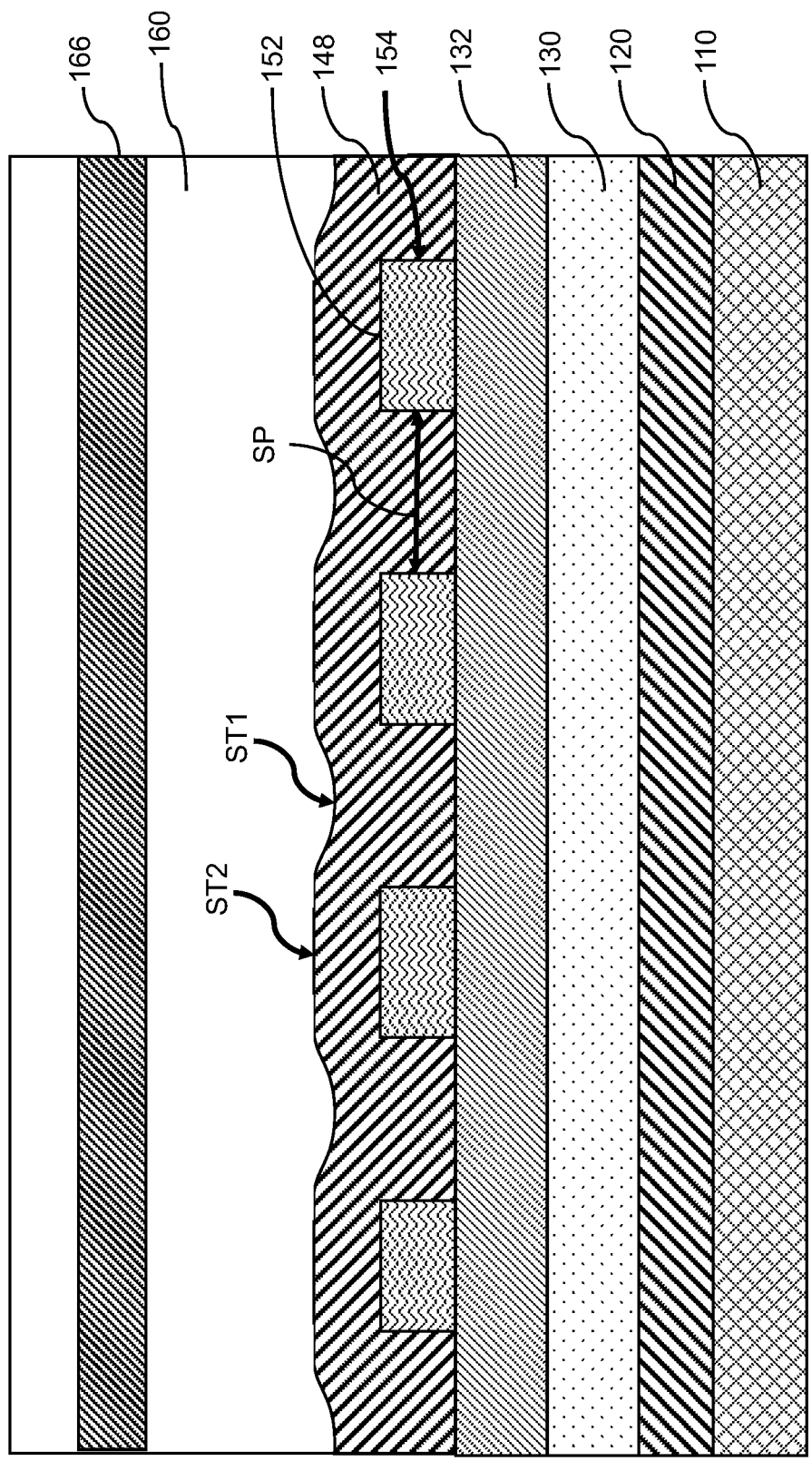
FIG. 1C is a cross-section view taken along line 1C-1C in FIG. 1B.

On the other hand, as shown in FIG. 1C reflecting a cross-section view taken along line 1C-1C in FIG. 1B, since the p-type doped III-V compound/nitride semiconductor islands 152 form some bumps 154 projecting from a top surface of the semiconductor layer 132, the drain 148 covering the p-type doped III-V compound/nitride semiconductor islands 152 and the second semiconductor layer 132 can be conformal with a profile of the islands 152. Specifically, the drain 148 has a top surface ST1 above an interval between the bumps 154 and a top surface ST2 above the bumps 154, and the top surface ST1 of the drain 148 is in a position lower than the top surface ST2 of the drain 148. The conformal profile serves as evidence that the drain 148 is formed to cover the bump-shaped p-type doped III-V compound/nitride semiconductor islands 152 which are arranged by the same spacing SP.

The exemplary materials of the p-type doped III-V compound/nitride semiconductor layer 150 include but are not limited to p-doped nitride semiconductor materials, such as p-type GaN, p-type AlGaN, p-type InN, p-type AlInN, p-type InGaN, p-type AlInGaN, or combinations thereof. In some embodiments, the p-doped materials are achieved by using p-type impurity, such as Be, Mg, Zn, Cd. In an embodiment, the p-type doped III-V compound/nitride semiconductor layers 142 and 150 have the same p-type doped III-V/nitride semiconductor material with the same thickness, and thus the p-type doped III-V compound/nitride semiconductor layers 142 and 150 may be selectively formed in the same process, which is advantageous to simplify the process for manufacturing the semiconductor device 100A. In an embodiment, the semiconductor layer 130 includes undoped GaN and the semiconductor layer 132 includes AlGaN, and both the p-type doped III-V compound layers 142 and 150 include p-type GaN. Since the dimension of the p-type doped III-V compound/nitride semiconductor layer/islands 150/152 is related to the effect on the reduction of the electric field at the drain edge, dimensions outside of the design (i.e. as aforementioned above) may cause the effect to get weak. Further, doping concentration of the p-type doped III-V compound/nitride semiconductor layer 150 is in a range from $1 \times 10^{17}$ cm$^{-3}$ to $1 \times 10^{20}$ cm$^{-3}$. Similarly, design concentrations outside of this range may cause the effect to get weak.

Referring to FIGS. 1A and 1B again, the semiconductor device 100A further includes one or more dielectric layer(s) 160 disposed on the semiconductor layer 132 and covering the gate structure 140. In addition, the dielectric layer 160 at least partially covers the p-type doped III-V compound/nitride semiconductor layer 150. For example, the side surface SS2 of the p-type doped III-V compound/nitride semiconductor layer 150 is covered by the dielectric layer 160, and the top surface ST and the two opposite side surfaces SS3 and SS4 thereof are at least partially covered by the dielectric layer 160 to form interfaces therebetween. That is, all of the side surfaces SS1-SS4 of the p-type doped III-V compound/nitride semiconductor layer 150 are covered by a combination of the dielectric layer 160 and the drain 148, such that the p-type doped III-V compound/nitride semiconductor layer 150 is totally surrounded by a combination of the semiconductor layer 132, the dielectric layer 160, and the drain 148. In some embodiments, the dielectric layer 160 serves as a passivation layer to protect the underlying elements or layers. In various embodiments, the dielectric layer 160 has a flat topmost surface, which is able to act as a flat base for carrying layers formed in a step subsequent to the formation of the dielectric layer 160. The exemplary material of the dielectric layer 160 can include, for example but is not limited to, SiN$_x$, SiO$_x$, SiON, SiC, SiBN, SiCBN, oxides, nitrides, or combinations thereof. In some embodiments, the dielectric layer 160 is a multi-layered structure, such as a composite dielectric layer of Al$_2$O$_3$/SiN, Al$_2$O$_3$/SiO$_2$, AlN/SiN, AlN/SiO$_2$, or combinations thereof.

The semiconductor device 100A further optionally includes a source field plate 162 disposed over the source 146, a first via 164 between the source field plate 162 and the source 146, a drain field plate 166 disposed over the drain 148, and a second via 168 between the drain field plate 166 and the drain 148, in which the source and drain field plates 162 and 166 are higher than the gate structure 140 with respect to the second semiconductor layer 132.

The source field plate 162 extends from a position above the source 146 to and over a position above the gate structure 140. In some embodiments, the source field plate 162 has an extending length greater than a distance from the source 146 to the gate structure 140. That is, a vertical projection of the gate structure 140 on the semiconductor layer 132 is present within a vertical projection of the source field plate 162 on the semiconductor layer 132. The first via 164 connects the source 146 and the source field plate 162, such that the source 146 and the source field plate 162 are electrically coupled with each other.

The drain field plate 166 extends from a position above the drain 148 toward the position above the gate structure 140. In some embodiments, the drain field plate 166 has an extending length less than a distance from the drain 148 to the gate structure 140. That is, a vertical projection of the gate structure 140 on the semiconductor layer 132 is out of a vertical projection of the drain field plate 166 on the semiconductor layer 132. In some embodiments, the extending length of the drain field plate 166 is greater than the width or length of the p-type doped III-V compound/nitride semiconductor layer 150, such that the vertical projection of the drain field plate 166 on the semiconductor layer 132 at least partially overlaps with a vertical projection of the p-type doped III-V compound/nitride semiconductor layer 150 on the semiconductor layer 132. In the exemplary illustration of FIG. 1A, the vertical projection of the p-type doped III-V compound/nitride semiconductor layer 150 is present within the vertical projection of the drain field plate 166 on the semiconductor layer 132. The second via 168 connects the drain 148 and the drain field plate 166, such that the drain 148 and the drain field plate 166 are electrically coupled with each other.

These source and drain field plates 162 and 166 change an electric field distribution of the source and drain regions and affect breakdown voltage of the semiconductor device 100A. In other words, the source and drain field plates 162 and 166 suppress the electric field distribution in desired regions and to reduce its peak value. The exemplary materials of the source and the drain field plates 162 and 166 can include, for example but are not limited to, metals, alloys, doped semiconductor materials (such as doped crystalline silicon), other suitable conductor materials, or combinations thereof.

Figure 1D:
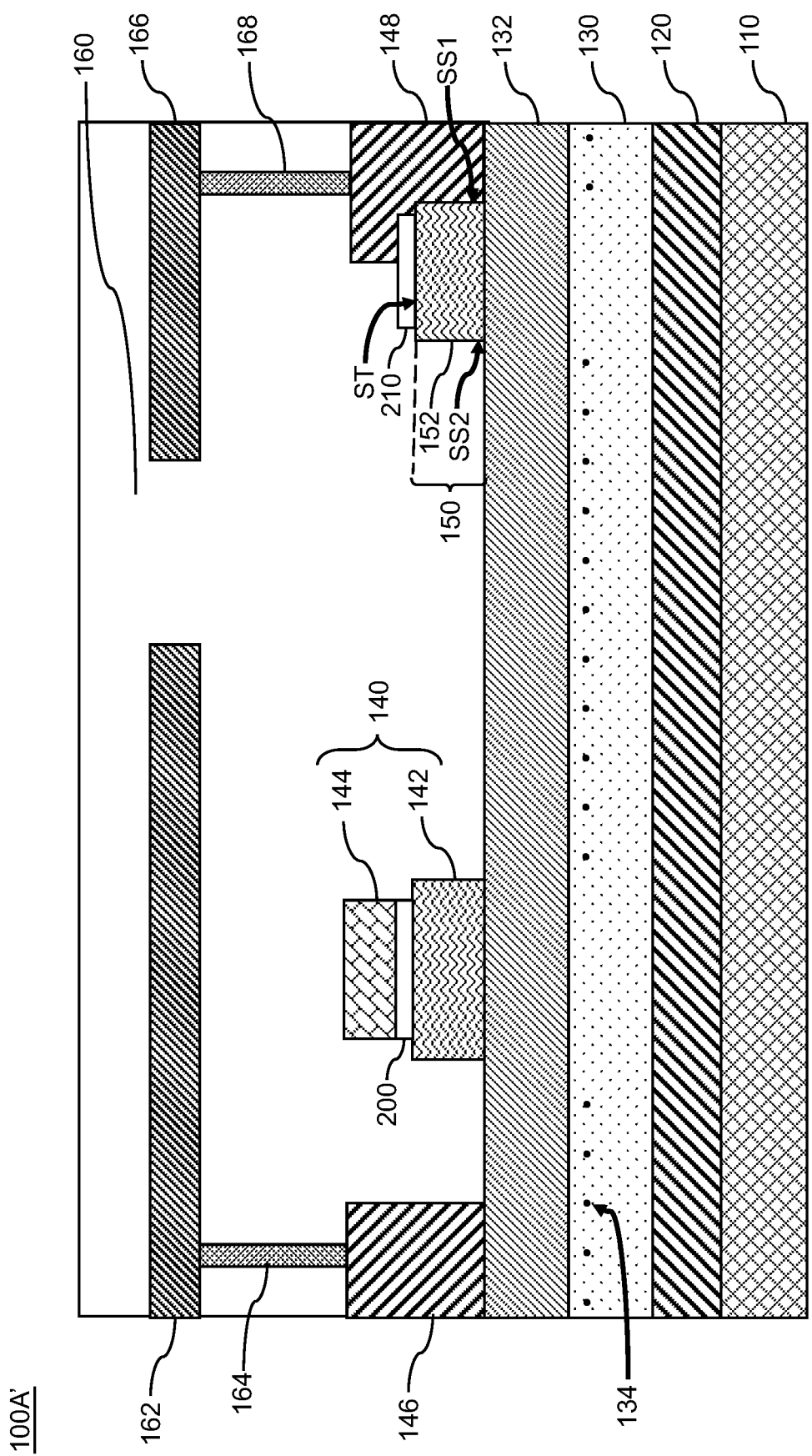
FIG. 1D is a cross-section view of a semiconductor device according to some other embodiments of a present disclosure.

Referring to FIG. 1D, which illustrates a cross-section view of a semiconductor device 100A' according to some other embodiments of a present disclosure. The semiconductor device 100A' is similar to the semiconductor device 100A as illustrated and described with reference to FIG. 1A, except that the gate 144 further includes a layer 200, and a layer 210 is formed between the drain 148 and the p-doped III-V compound/nitride semiconductor layer 150.

The layer 200 can include titanium nitride (TiN) or tantalum nitride (TaN) or other suitable material to facilitate formation of the gate 144. The layer 200 can include material(s) to form Schottky contact with p-doped III-V compound/nitride semiconductor layer 142. The layer 200 can include material(s) having relatively good adhesion or bonding force.

The layer 210 can include material same or similar to the layer 200. The layer 210 can include material(s) to form Schottky contact with the p-doped III-V compound/nitride semiconductor layer 150. The layer 210 can include material(s) having relatively good adhesion or bonding force. The layer 210 can include material(s) to deplete some holes in the p-doped III-V compound/nitride semiconductor layer 150 so as to function as a hole depletion layer. Although the layer 210 as illustrated in FIG. 1D covers only a portion of the p-doped III-V compound/nitride semiconductor layer 150, however, it is contemplated that the area or size of the layer 210 can be varied in some other embodiments to cover the complete top surface ST of the p-doped III-V compound/nitride semiconductor layer 150. Although the layer 210 as illustrated in FIG. 1D is formed between the p-doped III-V compound/nitride semiconductor layer 150 and the drain 148, however, it is contemplated that the area or size of the layer 210 can be varied or reduced in some other embodiments to merely cover the p-doped III-V compound/nitride semiconductor layer 150.

As discussed above, to avoid complete depletion of the 2DEG region 134 in the semiconductor layer 132, the p-doped III-V compound/nitride semiconductor layer 150 is separated into islands from a top-view perspective as shown in FIG. 1B so that the 2DEG region 134 can flow in the path between two islands. The layer 210, which is formed on the p-doped III-V compound/nitride semiconductor island(s) 152, forms a Schottky contact with the p-doped III-V compound/nitride semiconductor island(s) 152 to deplete some holes in the p-doped III-V compound/nitride semiconductor island(s) 152 to further avoid depletion of 2DEG (adjacent to the drain 148) in the semiconductor layer 132.

Figure 2:
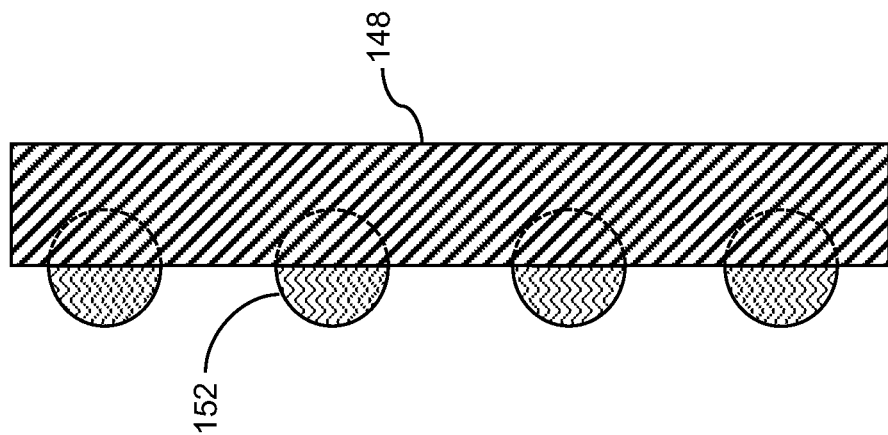
FIG. 2 is a top view of a semiconductor device according to some embodiments of the present disclosure.
Figure 2:
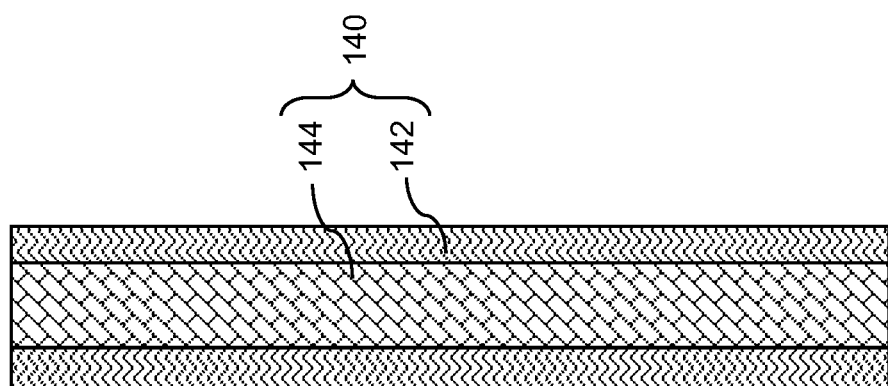
Figure 2:
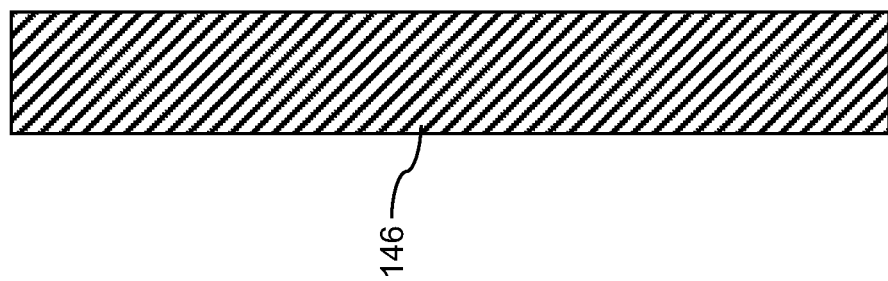

Referring to FIG. 2 illustrating a top view of a semiconductor device 100B according to some embodiments of the present disclosure, at least one difference between the present embodiment and the previous embodiment is that each of the p-type doped III-V compound/nitride semiconductor islands 152 viewed in the direction normal to the second semiconductor layer (see the semiconductor layer 132 in FIG. 1A or 1C) has an approximately circular configuration. With such configuration, interfaces of the drain 148 and the p-type doped III-V compound/nitride semiconductor islands 152 include curved boundaries, which correspond with the circular configuration of the p-type doped III-V compound/nitride semiconductor islands 152. In the exemplary embodiment of FIG. 2, approximately half of each of each p-type doped III-V compound/nitride semiconductor island 152 is covered by the drain 148 and another half of the same is free from coverage of the drain 148 (i.e. covered by a dielectric layer), and thus the two portions of the same p-type doped III-V compound/nitride semiconductor island 152, which are covered and uncovered by the drain 148 respectively, are semi-circles symmetrical with each other. However, the present disclosure is not limited thereto, in other embodiments, the ratio of the covered and uncovered portions of the same p-type doped III-V compound/nitride semiconductor island 152 is adjustable.

Figure 3:
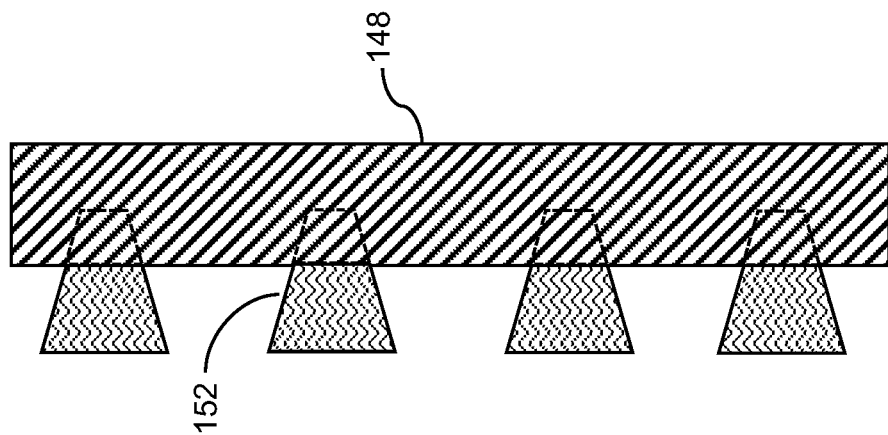
FIG. 3 is a top view of a semiconductor device according to some embodiments of the present disclosure.
Figure 3:
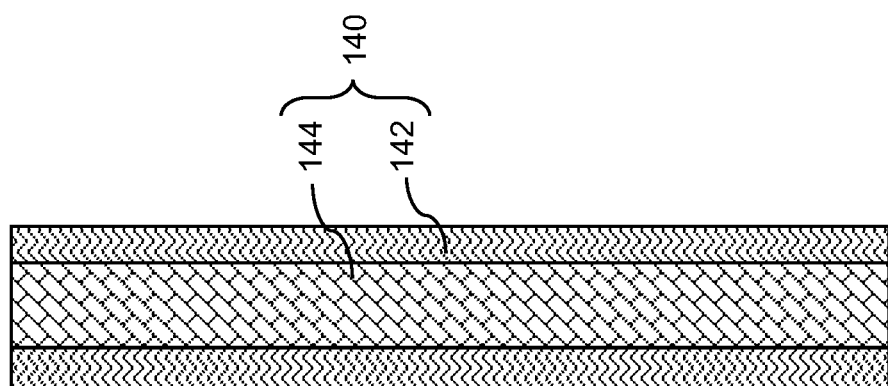
Figure 3:
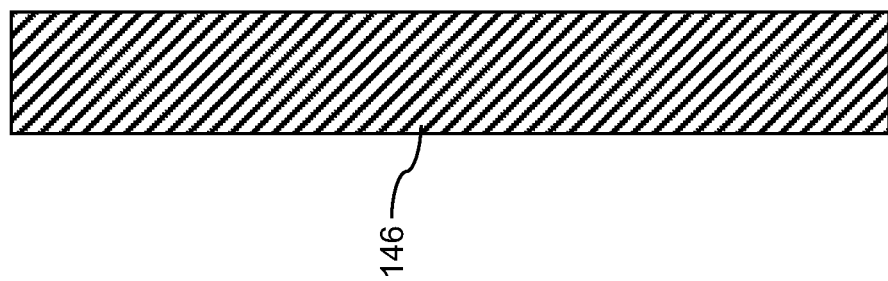

Referring to FIG. 3 illustrating a top view of a semiconductor device 100C according to some embodiments of the present disclosure, at least one difference between the present embodiment and the previous embodiment is that each of the p-type doped III-V compound/nitride semiconductor islands 152 viewed in the direction normal to the second semiconductor layer (see the semiconductor layer 132 in FIG. 1A or 1C) is tapered. In the exemplary embodiment of FIG. 3, for the single tapered p-type doped III-V compound/nitride semiconductor island 152, a shorter side of the taper is covered by the drain 148 and a longer side of the same is free from coverage of the drain 148 (i.e., it is covered by a dielectric layer). Similarly, the ratio of the covered and uncovered portions of the same p-type doped III-V compound/nitride semiconductor island 152 is adjustable.

In the present disclosure, the shapes of the p-type doped III-V compound/nitride semiconductor islands 152 are not limited to the above embodiments, as viewed in the direction normal to the second semiconductor layer, other two-dimensional shapes are available, such as polygonal, elliptic, or combinations thereof (i.e. even in combinations with the above-described shapes).

Figure 4A:
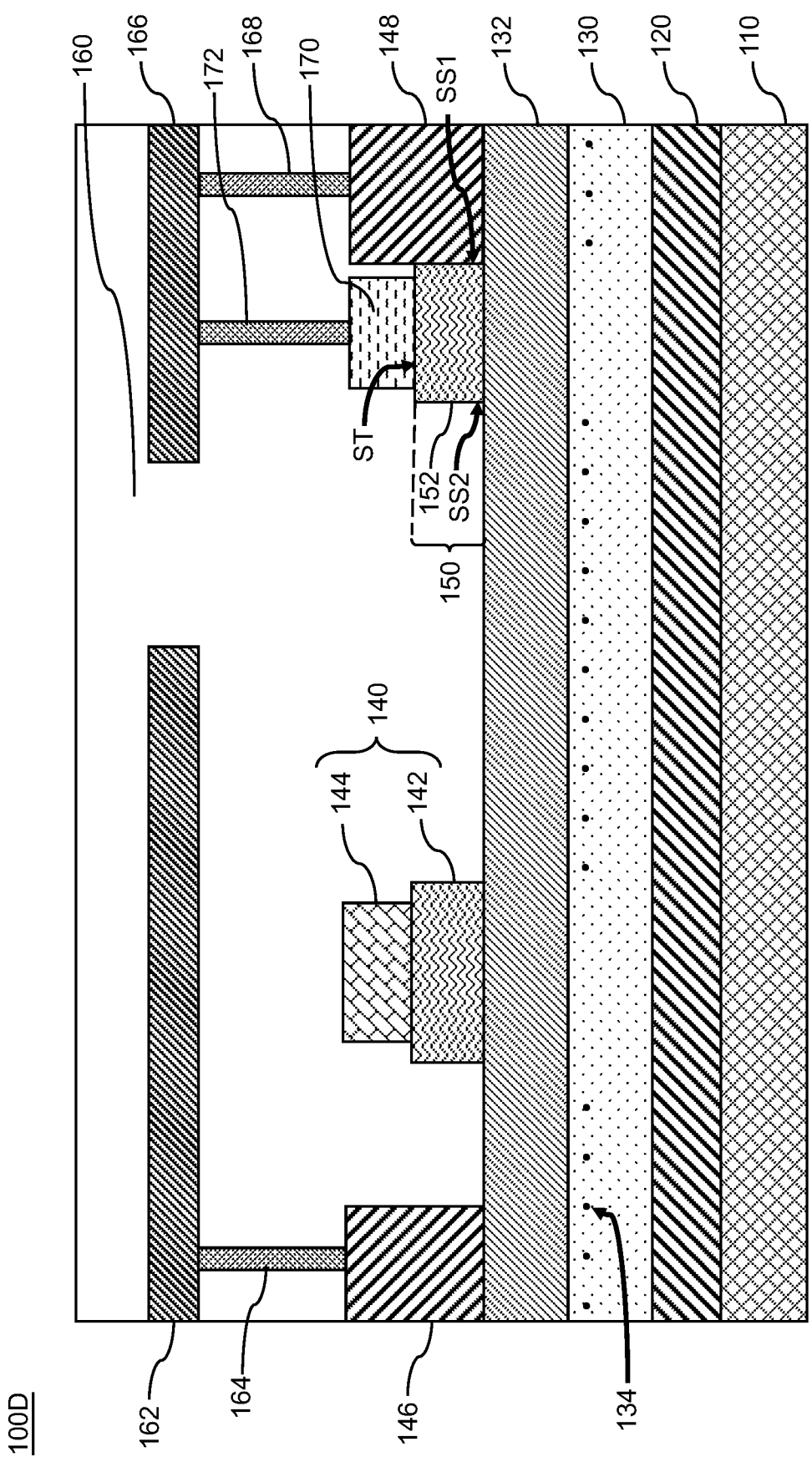
FIGS. 4A and 4B are cross-section and top views of a semiconductor device according to some embodiments of the present disclosure.
Figure 4B:
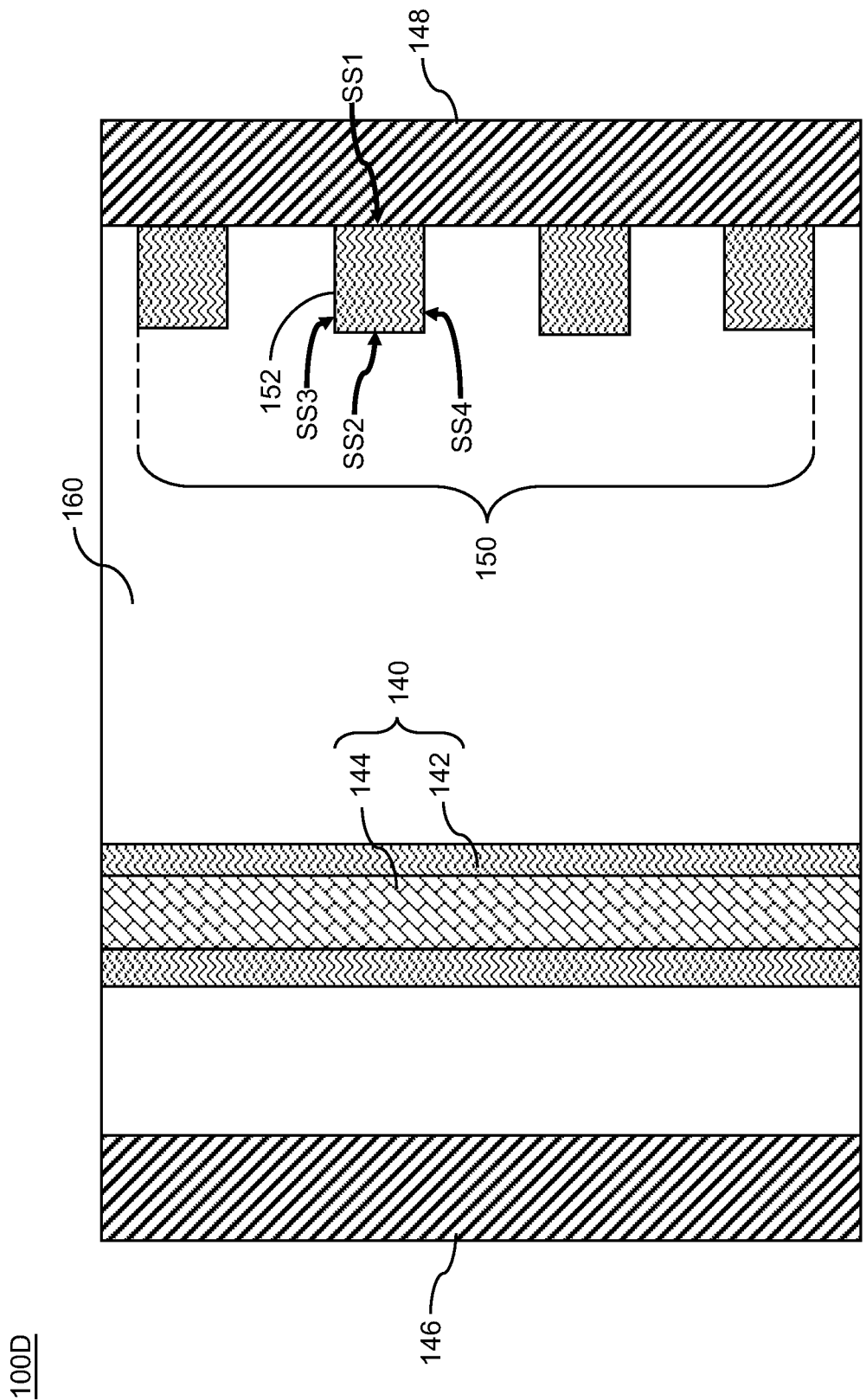

Referring to FIGS. 4A and 4B illustrating cross-section and top views of a semiconductor device 100D according to some embodiments of the present disclosure, at least one difference between the present embodiment and the previous embodiment is that the top surface ST of the p-type doped III-V compound/nitride semiconductor layer 150 is free from coverage of the drain 148. Specifically, in the exemplary illustration of FIGS. 4A and 4B, the side surface SS1 of the p-type doped III-V compound/nitride semiconductor island 152 forms an interface with the drain 148, and rest of the side surfaces SS2-SS4 of the p-type doped III-V compound/nitride semiconductor island 152 forms interfaces with the dielectric layer 160. Accordingly, vertical projections of the p-type doped III-V compound/nitride semiconductor layer 150 and the drain 148 on the semiconductor layer 132 have edges coinciding with each other, as shown in FIG. 4B.

The semiconductor device 100D further includes a conductive layer 170 disposed on the p-type doped III-V compound/nitride semiconductor layer 150 and a third via 172 between the conductive layer 170 and the drain field plate 166. The conductive layer 170 is in contact with the top surface ST of the p-type doped III-V compound/nitride semiconductor layer 150 and the third via 172 connects the drain field plate 166 and the conductive layer 170, such that the drain field plate 166 and the p-type doped III-V compound/nitride semiconductor layer 150 are electrically coupled with each other. In some embodiments, the conductive layer 170 is a metal layer and is formed in the same process as the gate 144, and thus the conductive layer 170 and the gate 144 have the same thickness and composition.

In the present disclosure, the relationship between the p-type doped III-V compound/nitride semiconductor layer 150 and the drain 148 is not limited to those depicted in the drawings. In other embodiments, the p-type doped III-V compound/nitride semiconductor layer 150 may be formed farther away from the drain 148, such that the p-type doped III-V compound/nitride semiconductor layer 150 is separated from the drain 148 by the dielectric layer 160 and all of the side surfaces SS1-SS4 of the p-type doped III-V compound/nitride semiconductor island 152 are covered by the dielectric layer 160. The relationship between the p-type doped III-V compound/nitride semiconductor layer 150 and the drain 148 is adjustable, while the effect provided by the p-type doped III-V compound/nitride semiconductor layer 150 to reduce the electric field at the drain side remains; and therefore, the process for manufacturing the semiconductor device 100D is flexible. The position for the p-type doped III-V compound/nitride semiconductor layer 150 may be selected depending upon the desired shaping of the drain electric field according to the ultimate application of the semiconductor device.

Figure 5A:
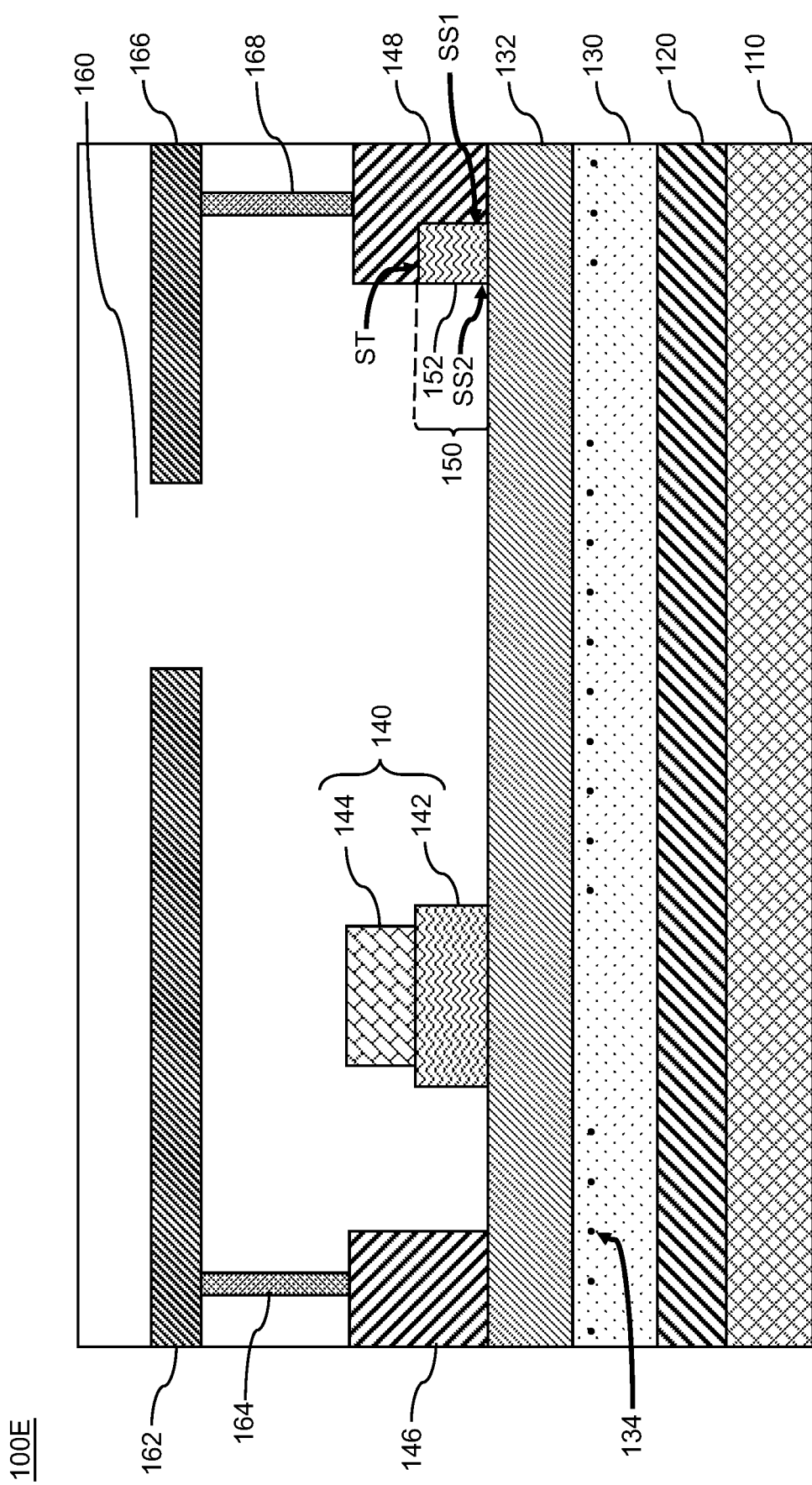
FIGS. 5A and 5B are cross-section and top views of a semiconductor device according to some embodiments of the present disclosure.
Figure 5B:
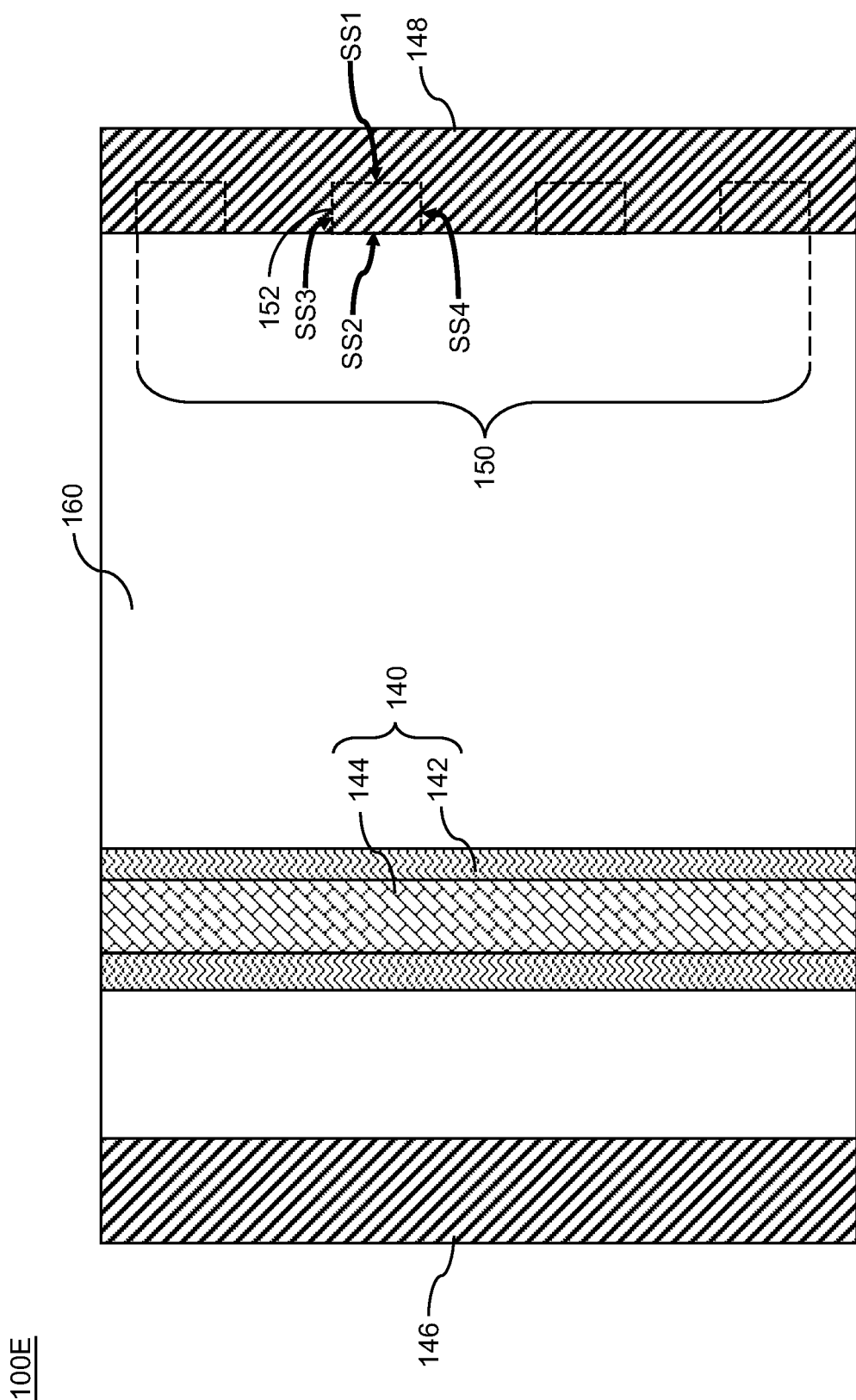

Referring to FIGS. 5A and 5B illustrating cross-section and top views of a semiconductor device 100E according to some embodiments of the present disclosure, at least one difference between the present embodiment and the previous embodiment is that the top surface ST of the p-type doped III-V compound/nitride semiconductor layer 150 is totally covered by of the drain 148. Specifically, in the exemplary illustration of FIGS. 5A and 5B, the p-type doped III-V compound/nitride semiconductor layer 150 is embedded into the drain 148, such that the side surface SS2 of the p-type doped III-V compound/nitride semiconductor island 152 is coplanar with a side surface of the drain 148 standing on the semiconductor 132 and facing the gate structure 140. Accordingly, a vertical projection of the p-type doped III-V compound/nitride semiconductor layer 150 on the semiconductor layer 132 is present within a vertical projection of the drain 148 on the semiconductor layer 132 with an edge thereof coinciding with an edge of the vertical projection of the drain 148. In such configuration, the p-type doped III-V compound/nitride semiconductor layer 150 is still able to reduce the electric field at the drain side, which is advantageous to make the process for manufacturing the semiconductor device 100E flexible.

In the present disclosure, a method for manufacturing a semiconductor device with a p-type doped III-V compound/nitride semiconductor layer for reducing an electrical field at a drain edge is provided. Different stages of a method for manufacturing the semiconductor device 100A are shown in FIGS. 6A-6C, and such stages can be applied to other semiconductor devices of different embodiments as described above.

Figure 6A:
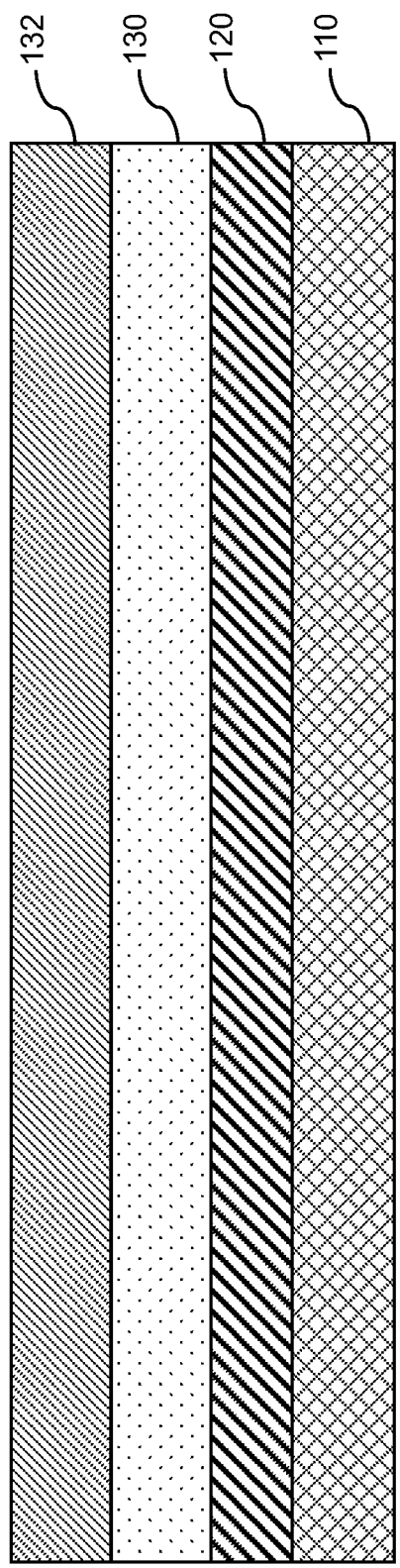
FIGS. 6A-6C are different stages of a method for manufacturing a semiconductor device according to some embodiments of the present disclosure.

Referring to FIG. 6A, a substrate 110 is provided, and one or more buffer layer 120, a semiconductor layer 130, and a semiconductor 132 are formed above the substrate 110 in sequence. In some embodiments, the buffer layer 120, the semiconductor layer 130, and the semiconductor 132 can be formed by using atomic layer deposition (ALD), physical vapor deposition (PVD), chemical vapor deposition (CVD), metal organic CVD (MOCVD), epitaxial growth, or other suitable processes.

Figure 6B:
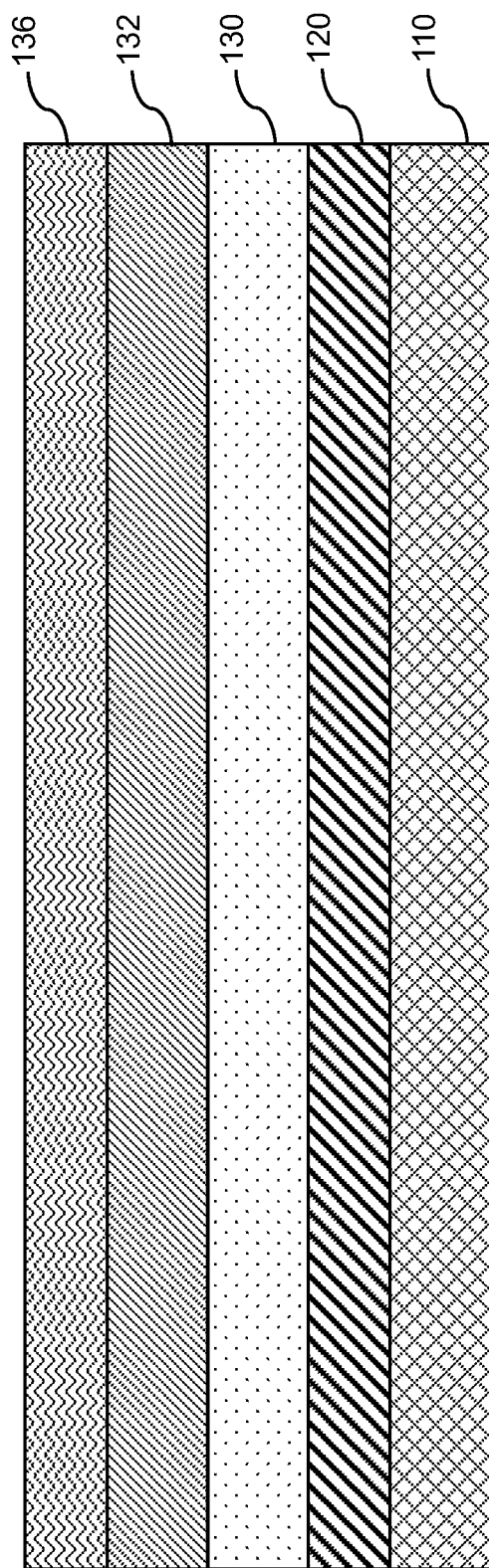

Referring to FIG. 6B, a blanket p-type doped III-V compound/nitride semiconductor layer 136 is formed on the semiconductor layer 132. In some embodiments, the blanket p-type doped III-V compound/nitride semiconductor layer 136 is formed by using an epitaxial growth process. In various embodiments, the blanket p-type doped III-V compound/nitride semiconductor layer 136 is formed by using a combination of deposition and ion implantation. For example, a blanket III-V compound/nitride semiconductor layer can be formed by using ALD, PVD, CVD, MOCVD first, and then an ion implantation process is performed, such that the blanket III-V compound/nitride semiconductor layer is doped with impurity to become the blanket p-type doped III-V compound/nitride semiconductor layer 136.

Figure 6C:
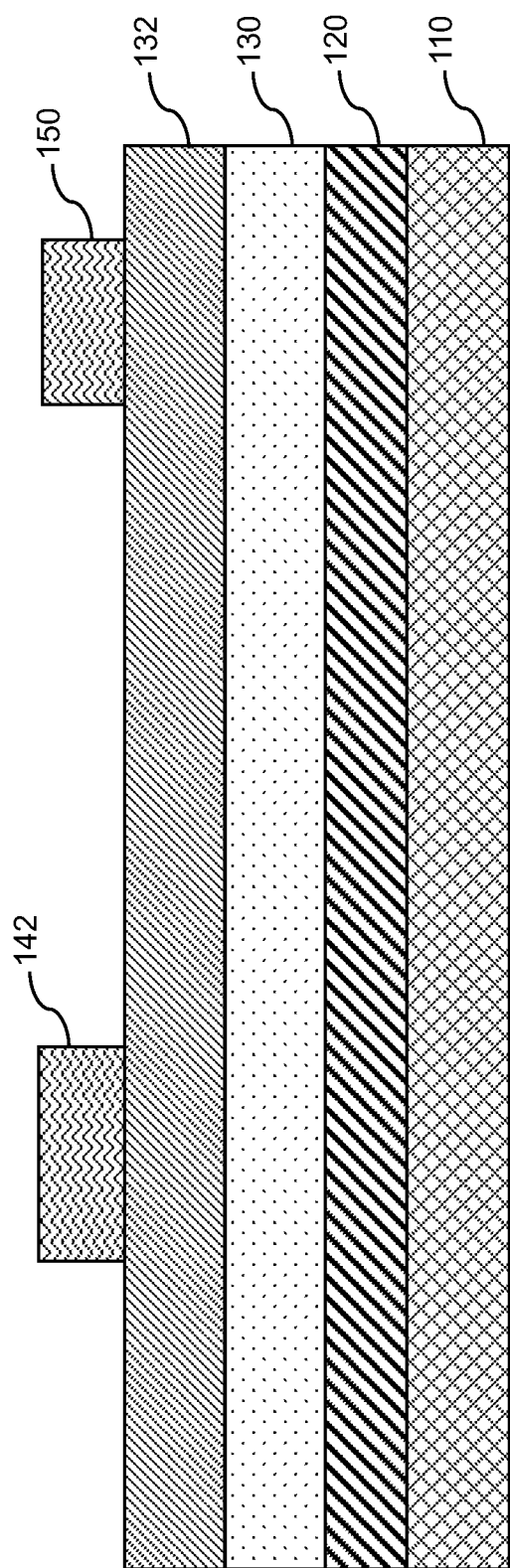

Referring to FIG. 6C, a patterning process is performed on the blanket p-type doped III-V compound/nitride semiconductor layer 136 to form a p-type doped III-V compound/nitride semiconductor layer 150 and a p-type doped III-V compound/nitride semiconductor layer 142 separated from each other, in which the p-type doped III-V compound/nitride semiconductor layer 150 is patterned as a plurality of p-type doped III-V compound/nitride semiconductor islands as afore-described. The patterning process determines shapes and locations (i.e. the locations on the second semiconductor layer 132) of the p-type doped III-V compound/nitride semiconductor islands. For example, a mask used in the patterning process has openings for defining the shapes of the p-type doped III-V compound/nitride semiconductor islands. In some embodiments, the patterning process is performed by photolithography, exposure and development, etching, other suitable processes, or combinations thereof.

After the stage of FIG. 6C, a metal gate, a source, a drain, vias, and field plates are formed on the semiconductor layer 132. In some embodiments, the metal gate, the source, the drain, the vias, and the field plates can be formed by using deposition techniques. The resultant structure is shown in FIGS. 1A-1C.

In some embodiments, during the formation of the drain by a deposition process, an interface area between the drain and the p-type doped III-V compound/nitride semiconductor layer increases as the deposition process proceeds (i.e., gradually increases). Furthermore, among the processes for forming these structures, at least one dielectric layer 160 is formed on the semiconductor layer 132. The dielectric materials formed in different stages may be merged with each other, thereby forming a dielectric layer structure on the semiconductor layer 132.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
a first nitride semiconductor layer;
a second nitride semiconductor layer disposed on the first nitride semiconductor layer and having a bandgap greater than a bandgap of the first nitride semiconductor layer;
a source and a single drain disposed on the second nitride semiconductor layer;
a gate structure disposed on the second nitride semiconductor layer and between the source and the drain;
a first p-type doped nitride semiconductor layer disposed on the second semiconductor layer and between the gate structure and the drain, at least a portion of the drain being positioned over at least a portion of the first p-type doped nitride semiconductor layer, the first p-type doped nitride semiconductor layer having a first side surface facing away from the gate structure and a top surface facing away from the second nitride semiconductor layer, and the first side and top surfaces forming at least partial interfaces with the drain such that the first p-type doped nitride semiconductor layer and the drain are electrically coupled with each other;
a second p-type doped nitride semiconductor layer disposed on the second semiconductor layer beneath the gate structure and having approximately the same thickness as that of the first p-type doped nitride semiconductor layer; and
a drain field plate disposed over at least a portion of the drain and electrically coupled to the drain and the first p-type doped nitride semiconductor layer.

2. The semiconductor device of claim 1, wherein the drain and the first p-type doped nitride semiconductor layer collectively form a step-shaped profile.

3. The semiconductor device of claim 1, wherein the first p-type doped nitride semiconductor layer has a second side surface that is opposite the first side surface thereof and coplanar with a side surface of the drain standing on the second nitride semiconductor surface.

4. The semiconductor device of claim 1, further comprising:
a dielectric layer disposed on the second nitride semiconductor layer, wherein all side surfaces of the first p-type doped nitride semiconductor layer are covered by a combination of the dielectric layer and the drain.

5. The semiconductor device of claim 1, wherein the first p-type doped nitride semiconductor layer includes a plurality of p-type doped nitride semiconductor compound islands separated from each other.

6. The semiconductor device according to claim 5, wherein each of the p-type doped nitride semiconductor islands is rectangular and has a length in a range from 0.1 micron to 3 microns and a width in a range from 0.1 micron to 3 microns.

7. The semiconductor device of claim 5, wherein each of the p-type doped nitride semiconductor islands viewed in a direction normal to the second semiconductor layer has a shape that is circular, tapered, polygonal, elliptical, or combinations thereof.

8. The semiconductor device according to claim 7, wherein an interface between the drain and the first p-type doped nitride semiconductor layer is curved.

9. The semiconductor device of claim 1, wherein the first nitride semiconductor layer comprises undoped GaN, the second nitride semiconductor layer comprises AlGaN, and the first and second p-type doped nitride semiconductor layers comprise p-GaN.

10. The semiconductor device of claim 1, wherein a vertical projection of the field plate on the second nitride semiconductor layer at least partially overlaps with a vertical projection of the first p-type doped nitride semiconductor layer on the second nitride semiconductor layer.

11. The semiconductor device of claim 1, further comprising:
a source field plate disposed at least partially over the source, extending towards the gate, and electrically coupled to the source.

12. The semiconductor device of claim 1, further comprising a substrate selected from silicon, silicon-germanium, silicon carbide, sapphire, gallium arsenide, p-doped silicon, n-doped silicon, or semiconductor on insulator substrates.

13. The semiconductor device according to claim 12, further comprising a buffer layer positioned on the substrate.

14. The semiconductor device according to claim 13, wherein the buffer layer comprises one or more layers of GaN, GaAs, InN, AlN, InGaN, AlGaN, InAlGaN, or combinations thereof.

15. The semiconductor device according to claim 1, wherein the semiconductor device has a breakdown voltage of at least 20V.

16. A method for manufacturing the semiconductor device of claim 1, comprising:
forming a first nitride semiconductor layer above a substrate;
forming a second nitride semiconductor layer on the first semiconductor layer, wherein the second nitride semiconductor layer has a bandgap greater than a bandgap of the first nitride semiconductor layer;
forming a blanket p-type doped nitride semiconductor layer on the second nitride semiconductor layer;
patterning the blanket p-type doped nitride semiconductor layer to form a first p-type doped nitride semiconductor layer and a second p-type doped nitride semiconductor layer separated from each other;
forming a source structure on the second semiconductor layer;
forming a drain structure at least partially overlying the first p-type doped nitride semiconductor layer;
forming a gate structure over the second p-type doped nitride semiconductor layer;
forming a drain field plate electrode over the drain structure and electrically connecting it to the drain structure.

17. The method of claim 16, further comprising:
patterning the first p-type doped nitride semiconductor as a plurality of p-type doped nitride semiconductor islands.

18. The method of claim 16, wherein the drain structure is formed by a deposition process, and an interface area between the drain structure and the first p-type doped nitride semiconductor layer increases as the deposition process proceeds.

19. The method of claim 16, wherein blanket p-type doped nitride semiconductor layer is formed by one or more of ALD, PVD, CVD, or MOCVD followed by an ion implantation process.

20. The method of claim 16 further comprising depositing a dielectric layer over the source, drain, and gate structures.

\* \* \* \* \*